US007629997B2

(12) United States Patent
Inuiya

(10) Patent No.: US 7,629,997 B2
(45) Date of Patent: Dec. 8, 2009

(54) INFORMATION READER

(75) Inventor: Masafumi Inuiya, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 349 days.

(21) Appl. No.: 11/763,714

(22) Filed: Jun. 15, 2007

(65) Prior Publication Data

US 2007/0292051 A1 Dec. 20, 2007

(30) Foreign Application Priority Data

Jun. 16, 2006 (JP) ............................ 2006-167599

(51) Int. Cl.
*H04N 5/33* (2006.01)
*H04N 3/14* (2006.01)
*H01L 29/78* (2006.01)

(52) U.S. Cl. ........................ 348/164; 348/308; 257/440

(58) Field of Classification Search ....................... None
See application file for complete search history.

(56) References Cited

U.S. PATENT DOCUMENTS

| | | | | |
|---|---|---|---|---|
| 4,238,760 A * | 12/1980 | Carr | ........................... | 257/443 |
| 4,651,001 A * | 3/1987 | Harada et al. | ............... | 250/330 |
| 7,154,157 B2 * | 12/2006 | Bradski et al. | .............. | 257/440 |
| 2005/0285038 A1 * | 12/2005 | Frangioni | ................... | 250/330 |

FOREIGN PATENT DOCUMENTS

JP 6-217125 A 8/1994

* cited by examiner

*Primary Examiner*—Justin P Misleh
(74) *Attorney, Agent, or Firm*—Sughrue Mion, PLLC

(57) ABSTRACT

An information reader includes an imaging device that images a subject illuminated with light in a first wavelength region; an information-reading unit that reads information expressed by a site absorbing light in a second wavelength region based on imaging signals from the imaging device; and an information output unit, wherein the imaging device is a stack-typed imaging device that includes a plurality of pixel sections containing stacked two photoelectric conversion devices, with each of the two photoelectric conversion devices receiving light from the same position of the subject and converting it into the imaging signal, the two photoelectric conversion devices are a first photoelectric conversion device and a second photoelectric conversion device, and the information output unit generates the information based on a first imaging signal and a second imaging signal and outputs the information.

15 Claims, 7 Drawing Sheets

FIG. 7

| SUBJECT | IMAGING DEVICE | | CONTRAST RATIO |
|---|---|---|---|
| A: WITH PRINTING | C: THE SPECTRAL SENSITIVITY IS COINCIDENT WITH THE ABSORPTION WAVELENGTH OF THE SUBJECT. | $\int A(\lambda)C(\lambda)d\lambda = 0.1$ | 0.1 / 0.9 = 1 / 9 |
| B: WITHOUT PRINTING | | $\int B(\lambda)C(\lambda)d\lambda = 0.9$ | |
| A: WITH PRINTING | D: THE SPECTRAL SENSITIVITY IS WIDER THAN THE ABSORPTION WAVELENGTH OF THE SUBJECT. | $\int A(\lambda)D(\lambda)d\lambda = 0.74$ | 0.74 / 0.9 = 1 / 1.22 |
| B: WITHOUT PRINTING | | $\int B(\lambda)D(\lambda)d\lambda = 0.9$ | |

INFORMATION READER

BACKGROUND OF THE INVENTION

1. Field of the Invention

The present invention relates to an information reader including an imaging device for imaging a subject illuminated with light in a first wavelength region and reading information expressed by a site for absorbing light in a second wavelength region equal to or narrower than the first wavelength region contained in the subject based on imaging signals from the imaging device.

2. Description of the Related Art

Hitherto, a method of printing a mark with an infrared light absorbing ink on a printed matter such as bills, a photograph, or the like, taking a picture of is printed matter or photograph in a state that the printed matter or photograph is illuminated with infrared light by using a sensor having sensitivity in an infrared wavelength region, and reading the mark from an imaging signal obtained by this picture-taking has been known (see, for example, JP-A-6-217125).

SUMMARY OF THE INVENTION

However, according to the related-art method, it was difficult to read a mark with high precision due to influences such as a fluctuation or scattering of the quantity of illumination light, unevenness in the reflection of a subject, a stain, and a smudge.

In view of the foregoing circumstances, the invention has been made, and the invention provides an information reader capable of reading information with high precision expressed by a site for absorbing light of a specified wavelength region contained in a subject.

(1) An information reader comprising:

an imaging device that images a subject illuminated with light in a first wavelength region;

an information-reading unit that reads information expressed by a site absorbing light in a second wavelength region, which is equal to or narrower than the first wavelength region contained in the subject, based on imaging signals from the imaging device; and an information output unit, wherein the imaging device is a stack-typed imaging device that comprises a plurality of pixel sections containing stacked two photoelectric conversion devices, with each of the two photoelectric conversion devices receiving light from the same position of the subject and converting it into the imaging signal, the two photoelectric conversion devices are a first photoelectric conversion device having sensitivity in the second wavelength region and a second photoelectric conversion device having sensitivity in a third wavelength region, which includes the second wavelength region and is wider than the second wavelength region, and the information output unit generates the information based on a first imaging signal obtained from the first photoelectric conversion device and a second imaging signal obtained form the second photoelectric conversion device, and outputs the information.

(2) The information reader as described in (1), wherein the information output unit comprises:

a luminance shading correction unit that corrects luminance shading generated in the first imaging signal obtained from the first photoelectric conversion device based on the second imaging signal obtained from the second photoelectric conversion device; and an information generation unit that generates the information from the first imaging signal after the correction.

(3) The information reader as described in (2), wherein the luminance shading correction unit takes a value, which is obtained by dividing the first imaging signal by the second imaging signal, as the first imaging signal after the correction.

(4) The information reader as described in (2), wherein the luminance shading correction unit takes a value, which is obtained by subtracting the second imaging signal from the first imaging signal, as the first imaging signal after the correction.

(5) The information reader as described in (2), wherein the information generation unit generates the information based on a value, which is obtained by binarizing the first imaging signal after the correction on the basis of a prescribed value.

(6) The information reader as described in (5), wherein the prescribed value is a median value between a maximum value and a minimum value of the first imaging signal after the correction, an average value of the first imaging signal after the correction, or a median value of a histogram of the first imaging signal after the correction.

(7) The information reader as described in (1), wherein the information output unit generates the information based on a value, which is obtained by binarizing the first imaging signal on the basis of the second imaging signal.

(8) The information reader as described in (1), wherein the information output unit comprises a noise removal unit that removes a noise component contained in the second imaging signal, and the second imaging signal which the information output unit uses for the purpose of generating the information is the second imaging signal after the removal of a noise component by the noise removal unit.

(9) The information reader as described in (1), wherein the first photoelectric conversion device comprises:

a pair of electrodes stacked above a semiconductor substrate; and an organic photoelectric conversion layer provided between the pair of electrodes, and the second photoelectric conversion device is a photodiode formed within the semiconductor substrate.

(10) The information reader as described in (9), further comprising:

an optical filter that is provided above the second photoelectric conversion device and transmits only light of the third wavelength region.

(11) The information reader as described in (1), wherein the first wavelength region is a specified range of an infrared region.

(12) The information reader as described in (9), wherein the first wavelength region is a specified range of an infrared region.

(13) The information reader as described in (12), wherein the organic photoelectric conversion layer comprises a phthalocyanine based compound.

(14) The information reader as described in (1), wherein the third wavelength region is an infrared region.

(15) The information reader as described in (1), wherein a light source for illuminating the subject is LED.

BRIEF DESCRIPTION OF THE DRAWING

FIG. 7 is a diagram to explain a contrast ratio of an imaging signal obtained from a first photoelectric conversion device and an imaging signal obtained from a second photoelectric conversion device;

DETAILED DESCRIPTION OF THE INVENTION

Embodiments of the invention are hereunder described with reference to the accompanying drawings.

Figure 1:
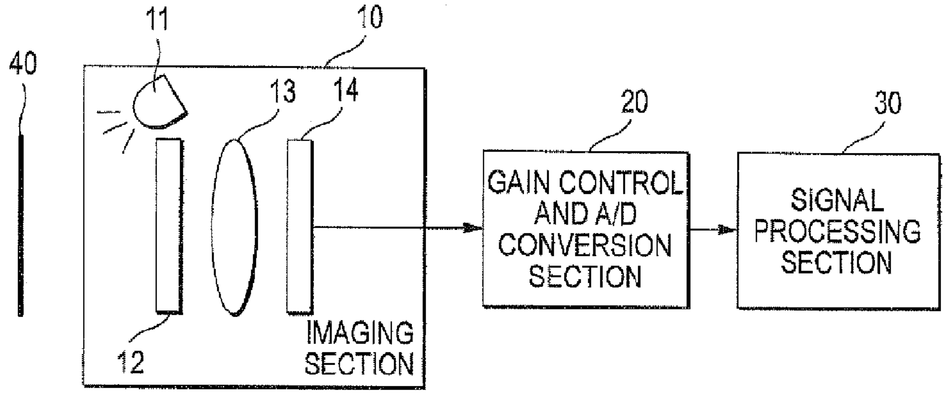
FIG. 1 is a view to show an outline configuration of an information reader for explaining an embodiment of the invention.

FIG. 1 is a view to show an outline configuration of an information reader for explaining an embodiment of the invention.

The information reader as illustrated in FIG. 1 includes an imaging section 10 for imaging a printed matter 40 which is a subject; a gain control and A/D conversion section 20 for controlling a gain of an imaging signal from the imaging section 10 to achieve digital conversion; and a signal processing section 30 for achieving prescribed signal processing by using an imaging signal from the gain control and A/D conversion section 20. A mark of a dot pattern or the like is printed on the printed matter 40 by an ink for absorbing light of a second wavelength region (for example, a wavelength range of from about 820 nm to about 910 nm) equal to narrower than a specified range of an infrared region as a first wavelength region (for example, a wavelength range of from about 760 nm to about 960 nm) or the like.

The imaging section 10 includes a light source 11 for irradiating light of a first wavelength region, such as LED; an infrared transmitting filter 12 for transmitting only light of an infrared region including the second wavelength region and wider than the second wavelength region (for example, a wavelength range of from about 740 nm to about 1,000 nm) as a third wavelength region; an optical system 13 arranged in the rear of the infrared transmitting filter 12, such as an imaging lens; and an imaging device 14 arranged in the rear of the optical system 13.

Figure 2:
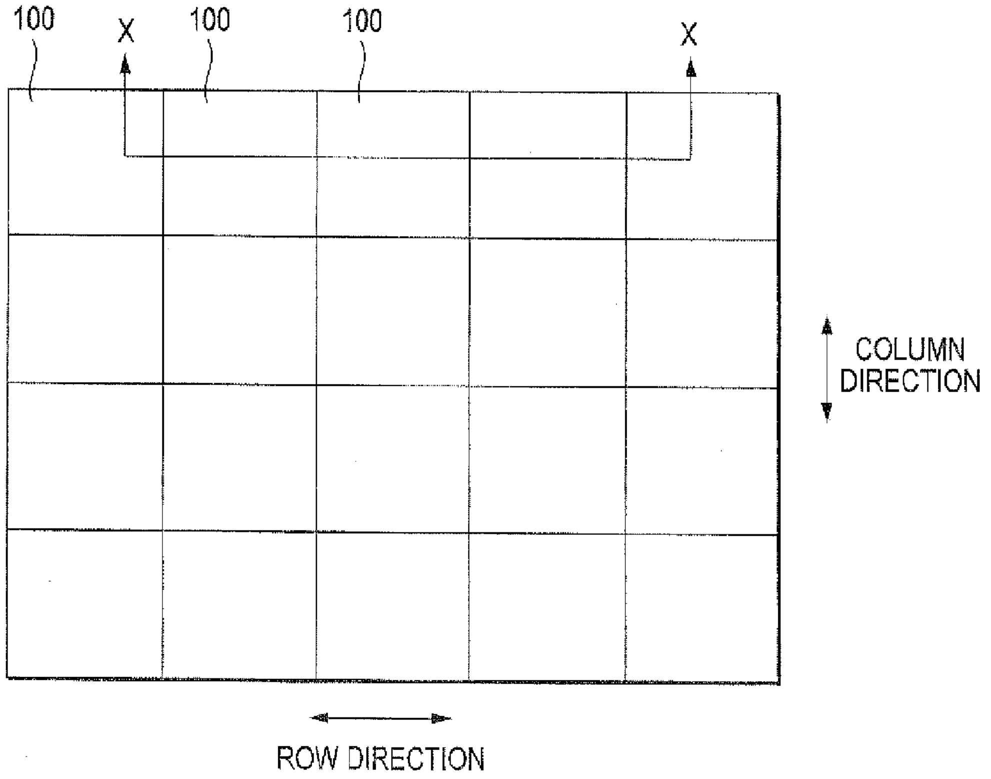
FIG. 2 is a planar schematic view of an imaging device as illustrated in FIG. 1.
Figure 3:
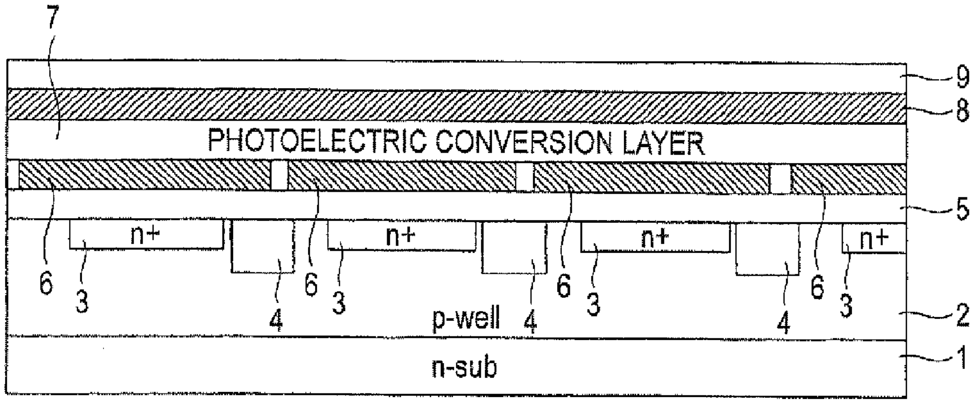
FIG. 3 is a cross-sectional schematic view of an X-X line as illustrated in FIG. 2.

FIG. 2 is a planar schematic view of the imaging device 14 as illustrated in FIG. 1. FIG. 3 is a cross-sectional schematic view of an X-X line as illustrated in FIG. 2.

As illustrated in FIG. 2, the imaging device 14 includes a number of pixel sections 100 disposed in a row direction and a column direction orthogonal thereto. The pixel section 100 contains stacked two photoelectric conversion devices (a first photoelectric conversion device and a second photoelectric conversion device), each of which receives light from the same position of the printed matter 40 to convert it into an electrical signal.

As illustrated in FIG. 3, an n-type impurities region 3 (hereinafter referred to as "n-region 3") is formed on a surface section of a p-well layer 2 formed on an n-type silicon substrate 1; and a photodiode which is a second photoelectric conversion device is configured by pn junction between the p-well layer 2 and the n-region 3.

A dielectric layer 5 which is transparent to incident light, such as silicon oxide, is formed on the p-well layer 2 via a gate dielectric layer (not illustrated). A pixel electrode 6 which is transparent to incident light and which is made of a polysilicon, etc., as separated for every pixel section 100, is formed on the dielectric layer 5 in an upper part of the n-region 3; and a photoelectric conversion layer 7 made of an organic material is formed on the pixel electrode 6. A counter electrode 8 which is transparent to incident light and which is made of a polysilicon, etc., as configured of a single sheet common to all of the pixel sections 100, is formed on the photoelectric conversion layer 7; and a passivation layer 9 which is transparent to incident light and which is made of a dielectric layer, etc. is formed on the counter electrode 8. A first photoelectric conversion device is configured of the pixel electrode 6, the counter electrode 8 and the photoelectric conversion layer 7 interposed between these electrodes.

A signal readout section 4 for reading out a signal corresponding to a charge generated in each of the first photoelectric conversion device and the second photoelectric conversion device contained in the pixel section 100 is provided and formed corresponding to the pixel section 100 within the p-well layer 2.

Figure 4:
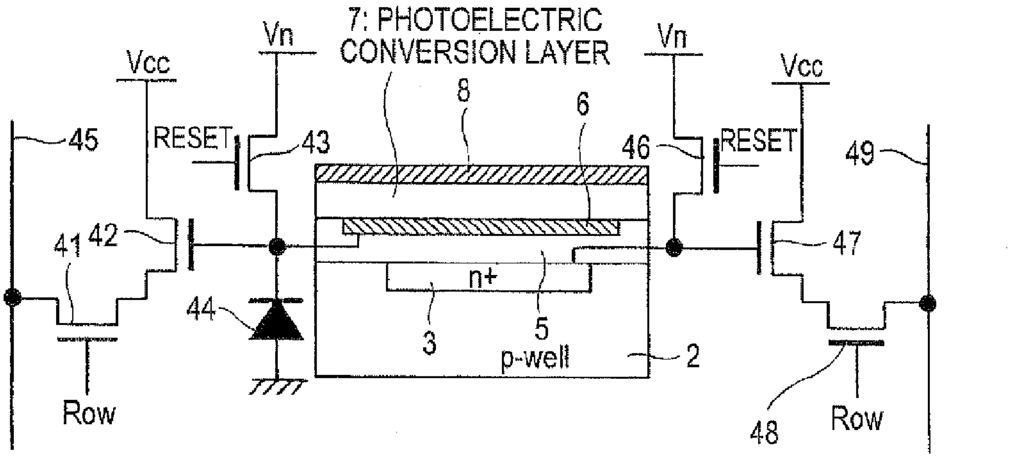
FIG. 4 is a view to show a specific configuration example of a signal readout section as illustrated in FIG. 3.

FIG. 4 is a view to show a specific configuration example of the signal readout section 4 as illustrated in FIG. 3.

The signal readout section 4 is configured of an n-type impurities region formed within the p-well layer 2 and includes an accumulation diode 44 for accumulating a charge generated in the photoelectric conversion layer 7, a reset transistor 43 in which a drain thereof is connected to the accumulation diode 44 and a source thereof is connected to a power source Vn, an output transistor 42 in which a gate thereof is connected to the drain of the reset transistor 43 and a source thereof is connected to a power source Vcc, a line section transistor 41 in which a source thereof is connected to a drain of the output transistor 42 and a drain thereof is connected to a signal output line 45, a reset transistor 46 in which a drain thereof is connected to the n-region 3 and a source thereof is connected to a power source Vn, an output transistor 47 in which a gate thereof is connected to the drain of the reset transistor 46 and a source thereof is connected to a power source Vcc, and a line selection transistor 48 in which a source thereof is connected to the drain of the output transistor 47 and a drain thereof is connected to a signal output line 49.

The accumulation diode 44 is electrically connected to the pixel electrode 6 by a contact section (not illustrated) which is embedded within the dielectric layer 5 and which is made of aluminum, etc.

By applying a bias voltage between the pixel electrode 6 and the counter electrode 8, a charge is generated corresponding to light incident to the photoelectric conversion layer 7, and this charge is transferred into the accumulation diode 44 via the pixel electrode 6. The charge accumulated in the accumulation diode 44 is converted into a signal corresponding to the amount of charge in the output transistor 42. Then, by turning on the line selection transistor 41, a signal is outputted into the signal outline line 45. After outputting a signal, the charge within the accumulation diode 44 is reset by the reset transistor 43.

A charge generated in the n-region 3 and accumulated therein is converted into a signal corresponding to the amount of charge in the output transistor 47. Then, by turning on the line selection transistor 48, a signal is outputted into the signal outline line 49. After outputting a signal, the charge within the n-region 3 is reset by the reset transistor 46.

Thus, the signal readout section 4 can be configured of a known MOS circuit made of three transistors.

Figure 5:
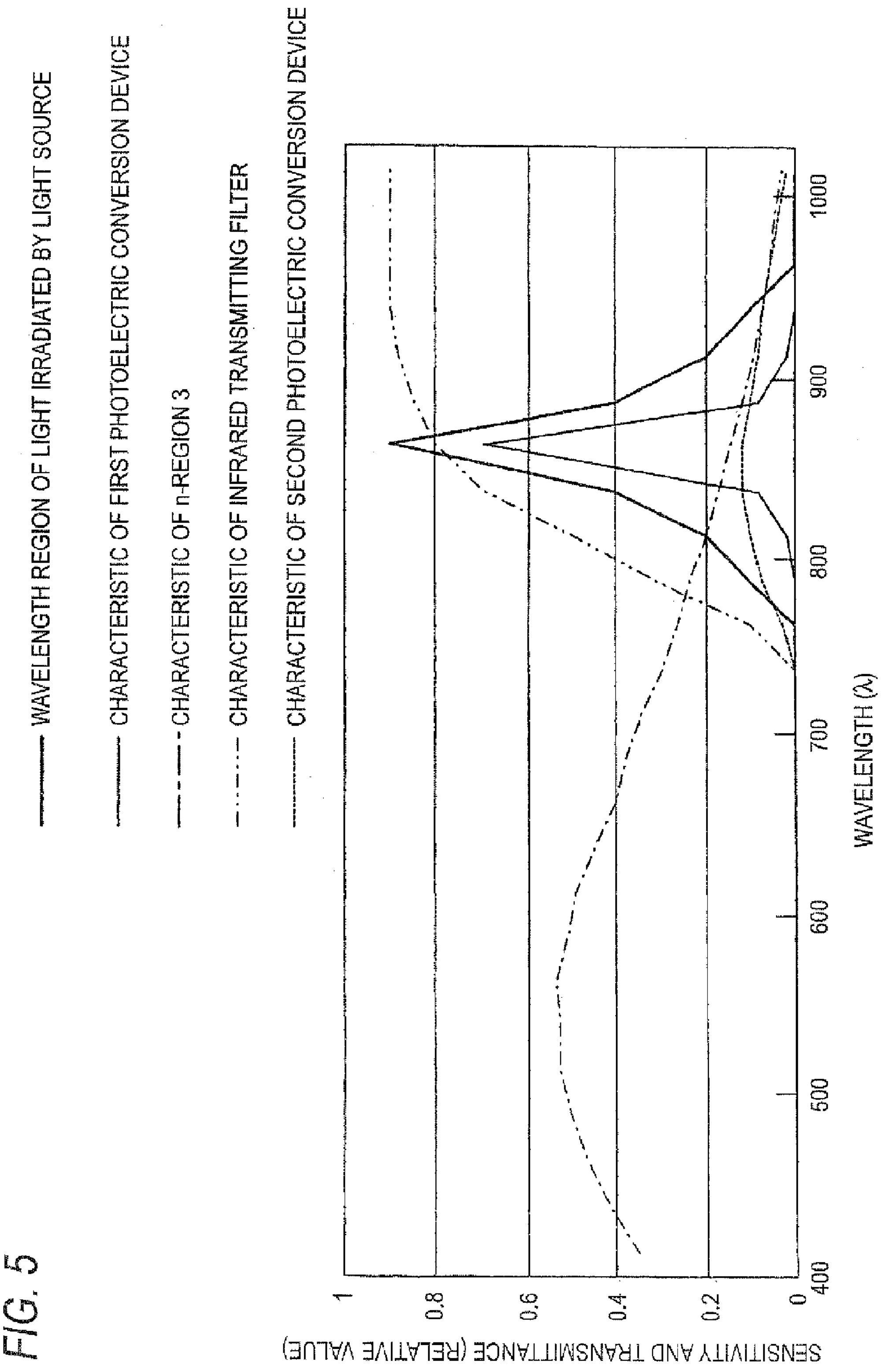
FIG. 5 is a diagram to show spectral sensitivity characteristics of a first photoelectric conversion device and a second photoelectric conversion device.

FIG. 5 is a diagram to shown spectral sensitivity characteristics of the first photoelectric conversion device and the second photoelectric conversion device.

The first photoelectric conversion device has sensitivity in a second wavelength region as shown by a thin solid line in FIG. 5. Examples of a material of the photoelectric conversion layer 7 for realizing such sensitivity include phthalocyanine based compounds such as naphthalocyanine and phthalocyanine.

In the invention, though any material may be used as the organic compound used for the organic photoelectric conversion layer of a near infrared to infrared region (absorption region of 700 nm or more), an organic dye having absorption in a near infrared to infrared region (absorption region of 700 nm or more) (this dye will be hereinafter referred to as "infrared dye") can be preferably used.

In the invention, it is preferable that the organic photoelectric conversion layer contains an organic p-type semiconductor (compound) or an organic n-type semiconductor (compound). Though any material is useful, the case where at least one infrared dye is used as such an organic semiconductor and the case where an organic semiconductor which is colorless or does not have absorption in a near infrared to infrared region (absorption region of 700 nm or more) is used and an infrared dye is added thereto are preferable.

Though any dye is useful as the infrared dye, preferred examples thereof include cyanine dyes, styryl dyes, hemicyanine dyes, merocyanine dyes (inclusive of zeromethinemerocyanine (simple merocyanine)), trinuclear merocyanine dyes, tetranuclear merocyanine dyes, rhodacyanine dyes, complex cyanine dyes, complex merocyanine dyes, alopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugide dyes, perylene dyes, phenazine dyes, phenothiazine dyes, quinone dyes, quinoneimine dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, diketopyrropyrrole dyes, dioxane dyes, porphyrin dyes, chlorophyll dyes, phthalocyanine dyes, metal complex dyes, fused aromatic carbocyclic dyes (for example, naphthalene derivatives, anthracene derivatives, phenanthrene derivatives, tetracene derivatives, pyrene derivatives, perylene derivatives, and fluoranthene derivatives), dioxadine dyes, anthanethrone dyes, azulenium dyes, pyrylium dyes, thiopyrylium dyes, xanthene dyes, threne dyes, toluidine dyes, and pyrazoline dyes.

Next, the metal complex compound is described. The metal complex compound is a metal complex having a ligand containing at least one of a nitrogen atom, an oxygen atom and a sulfur atom coordinated to a metal. Though a metal ion in the metal complex is not particularly limited, it is preferably a beryllium ion, a magnesium ion, an aluminum ion, a gallium ion, a zinc ion, an indium ion, or a tin ion; more preferably a beryllium ion, an aluminum ion, a gallium ion, or a zinc ion; and further preferably an aluminum ion or a zinc ion. As the ligand which is contained in the metal complex, there are enumerated various known ligands. Examples thereof include ligands described in H. Yersin, *Photochemistry and Photophysics of Coordination Compounds,* Springer-Verlag, 1987; and Akio Yamamoto, *Organometallic Chemistry—Principles and Applications—*, Shokabo Publishing Co., Ltd., 1982.

The foregoing ligand is preferably a nitrogen-containing heterocyclic ligand (having preferably from 1 to 30 carbon atoms, more preferably from 2 to 20 carbon atoms, and especially preferably from 3 to 15 carbon atoms, which may be a monodentate ligand or a bidentate or polydentate ligand, with a bidentate ligand being preferable; and examples of which include a pyridine ligand, a bipyridyl ligand, a quinolinol ligand, and a hydroxyphenylazole ligand (for example, a hydroxyphenylbenzimidazole ligand, a hydroxyphenylbenzoxazole ligand, and a hydroxyphenylimidazole ligand)), an alkoxy ligand (having preferably from 1 to 30 carbon atoms, more preferably from 1 to 20 carbon atoms, and especially preferably from 1 to 10 carbon atoms, examples of which include methoxy, ethoxy, butoxy, and 2-ethylhexyloxy), an aryloxy ligand (having preferably from 6 to 30 carbon atoms, more preferably from 6 to 20 carbon atoms, and especially preferably from 6 to 12 carbon atoms, examples of which include phenyloxy, 1-naphthyloxy, 2-naphthyloxy, 2,4,6-trimethylphenyloxy, and 4-biphenyloxy), an aromatic heterocyclic oxy ligand (having preferably from 1 to 30 carbon atoms, more preferably from 1 to 20 carbon atoms, and especially preferably from 1 to 12 carbon atoms, examples of which include pyridyloxy, pyrazyloxy, pyrimidyloxy, and quinolyloxy), an alkylthio ligand (having preferably from 1 to 30 carbon atoms, more preferably from 1 to 20 carbon atoms, and especially preferably from 1 to 12 carbon atoms, examples of which include methylthio and ethylthio), an arylthio ligand (having preferably from 6 to 30 carbon atoms, more preferably from 6 to 20 carbon atoms, and especially preferably from 6 to 12 carbon atoms, examples of which include phenylthio), a heterocyclic substituted thio ligand (having preferably from 1 to 30 carbon atoms, more preferably from 1 to 20 carbon atoms, and especially preferably from 1 to 12 carbon atoms, examples of which include pyridylthio, 2-benzimidazolylthio, 2-benzoxazolylthio, and 2-benzothiazolylthio), or a siloxy ligand (having preferably from 1 to 30 carbon atoms, more preferably from 3 to 25 carbon atoms, and especially preferably from 6 to 20 carbon atoms, examples of which include a triphenyloxy group, a triethoxysiloxy group, and a triisopropylsiloxy group); more preferably a nitrogen-containing heterocyclic ligand, an aryloxy ligand, an aromatic heterocyclic oxy ligand, or a siloxy ligand; and further preferably a nitrogen-containing heterocyclic ligand, an aryloxy ligand, or a siloxy ligand.

Though any of the foregoing dyes may be used as the infrared dye which is used in the invention, a plurality of the dyes may be used. Also, a pigment may be use as such a dye.

The layer which the infrared dye forms may be in any of an amorphous state, a liquid crystal state or a crystal state. In the case where the infrared dye is used in a crystal state, it is preferred to use a pigment.

As the infrared dye which is used in the invention, a phthalocyanine based compound represented by the following general formula (I) is especially preferable.

General Formula (I)

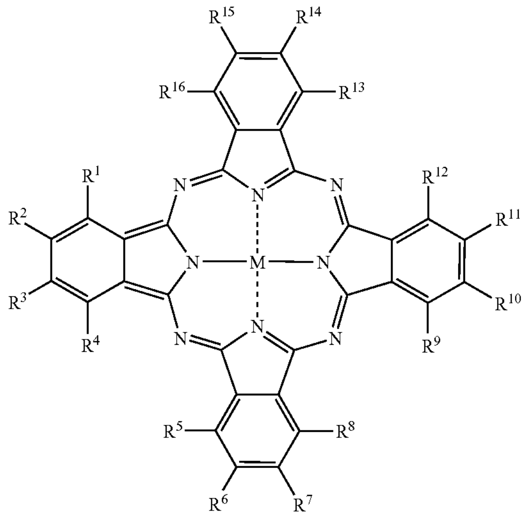

In the formula, M represents a hydrogen atom or a metal atom; and $R^1$ to $R^{16}$ each independently represents a hydrogen atom or a substituent.

The general formula (I) is hereunder described in detail.

In the general formula (I), M represents a hydrogen atom or a metal atom. M is preferably a metal atom. In the case where M represents a metal atom, any metal capable of forming a stable complex is useful. Examples of the metal which can be used include Li, Na, K, Be, Mg, Ca, Ba, Al, Si, Cd, Hg, Cr, Fe, Co, Ni, Cu, Zn, Ge, Pd, Cd, Sn, Pt, Pb, Sr, V, and Mn. Of these, Mg, Ca, Co, Zn, Pd, V and Cu are preferable; Co, Pd, Zn, V and Cu are more preferable; and Cu and V are especially preferable. Incidentally, in the case where M represents a hydrogen atom, the general formula (I) is expressed as follows.

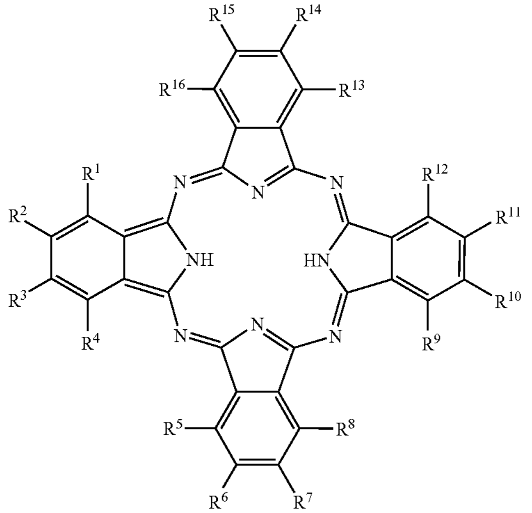

The substituent which can be imparted to the compound represented by the general formula (I) is hereunder described.

In the invention, in the case where a specified portion is called as "group", it is meant that the subject portion may not be substituted by itself or may be substituted with one or more kinds of substituents (to a possible maximum number). For example, the "alkyl group" means a substituted or unsubstituted alkyl group. Also, the substituent which can be used for the compound in the invention may be any substituent regardless of the presence or absence of substitution.

When such a substituent is designated as "W", any substituent is useful as the substituent represented by W, and there are no particular limitations. Examples thereof a halogen atom, an alkyl group (inclusive of a cycloalkyl group, a bicycloalkyl group, and a tricycloalkyl group), an alkenyl group (inclusive of a cyclolalkenyl group and a bicycloalkenyl group), an alkynyl group, an aryl group, a heterocyclic group (which may also be called as "hetero-ring group"), a cyano group, a hydroxyl group, a nitro group, a carboxyl group, an alkoxy group, an aryloxy group, a silyloxy group, a hetero-ring oxy group, an acyloxy group, a carbamoyloxy group, an alkoxycarbonyloxy group, an aryloxycarbonyloxy group, an amino group (inclusive of an anilino group), an ammonio group, an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, a hetero-ring thio group, a sulfamoyl group, a sulfo group, an alkyl- or arylsulfinyl group, an alkyl- or arylsulfonyl group, an acyl group, an aryloxycarbonyl group, an alkoxycarbonyl group, a carbamoyl group, an aryl or hetero-ring azo group, an imide group, a phosphono group, a phosphinyl group, a phosphinyloxy group, a phosphinylamino group, a phosphono group, a silyl group, a hydrazino group, a ureido group, a boronic acid group ($—B(OH)_2$), a phosphato group ($—OPO(OH)_2$), a sulfato group ($—OSO_3H$), and other known substituents.

In more detail, W represents a halogen atom (for example, a fluorine atom, a chlorine atom, a bromine atom, and an iodine atom), an alkyl group [representing a linear, branched or cyclic, substituted or unsubstituted alkyl group, inclusive of an alkyl group (preferably an alkyl group having from 1 to 30 carbon atoms, for example, methyl, ethyl, n-propyl, isopropyl, t-butyl, n-butyl, n-octyl, eicosyl, 2-chloroethyl, 2-cyanoethyl, and 2-ethylhexyl), a cycloalkyl group (preferably a substituted or unsubstituted cycloalkyl group having from 3 to 30 carbon atoms, for example, cyclohexyl, cyclopentyl, and 4-n-dodecylcyclohexyl), a bicycloalkyl group (preferably a substituted or unsubstituted bicycloalkyl group having from 5 to 30 carbon atoms, namely a monovalent group resulting from removing one hydrogen atom from a bicycloalkane having from 5 to 30 carbon atoms, for example, bicyclo[1,2,2]heptan-2-yl and bicyclo[2,2,2]octan-3-yl), and one having a lot of ring structures such as a tricyclic structure; and though an alkyl group in the following substituent (for example, an alkyl group in an alkylthio group) represents an alkyl group having such a concept, it further includes an alkenyl group and an alkynyl group], an alkenyl group [representing a linear, branched or cyclic, substituted or unsubstituted alkenyl group, inclusive of an alkenyl group (preferably a substituted or unsubstituted alkenyl group having from 2 to 30 carbon atoms, for example, vinyl, allyl, pulenyl, geranyl, and oleyl), a cycloalkenyl group (preferably a substituted or unsubstituted cycloalkenyl group having from 3 to 30 carbon atoms, namely a monovalent group resulting from removing one hydrogen atom of a cycloalkene having from 3 to 30 carbon atom, for example, 2-cyclopenten-1-yl and 2-cyclohexen-1-yl), and a bicycloalkenyl group (a substituted or unsubstituted bicycloalkenyl group, and preferably a substituted or unsubstituted bicycloalkenyl group having from 5 to 30 carbon atoms, namely a monovalent group resulting from removing one hydrogen atom of a bicycloalkene having one double bond, for example, bicyclo[2,2,1]hept-2-ene and bicyclo[2,2,2]oct-2-en-4-yl)], an alkynyl group (preferably a substituted or unsubstituted alkynyl group having from 2 to 30 carbon atoms, for example, ethynyl, propargyl, and trimethylsilylethynyl), an aryl group (preferably a substituted or unsubstituted aryl group having from 6 to 30 carbon atoms, for example, phenyl, p-tolyl, naphthyl, m-chlorophenyl, o-hexadecanoylaminophenyl, and ferrocenyl), a heterocyclic group (preferably a monovalent group resulting from removing one hydrogen atom from a 5- or 6-membered, substituted or unsubstituted, aromatic or non-aromatic heterocyclic compound, and more preferably a 5- or 6-membered aromatic heterocyclic group having from 3 to 30 carbon atoms, for example, 2-furyl, 2-thienyl, 2-pyrimidinyl, and 2-benzothiazolyl; and incidentally, this heterocyclic group may be a cationic heterocyclic group such as 1-methyl-2-pyridinio and 1-methyl-2-quinolinio), a cyano group, a hydroxyl group, a nitro group, a carboxyl group, an alkoxy group (preferably a substituted or unsubstituted alkoxy group having from 1 to 30 carbon atoms, for example, methoxy, ethoxy, isopropoxy, t-butoxy, n-octyloxy, and 2-methoxyethoxy), an aryloxy group (preferably a substituted or unsubstituted aryloxy group having from 6 to 30 carbon atoms, for example, phenoxy, 2-methylphenoxy, 4-t-butylphenoxy, 3-nitrophenoxy, and 2-tetradecanoylaminophenoxy), a silyloxy group (preferably a silyloxy group having from 3 to 20 carbon atoms, for example, trimethylsilyloxy and t-butyldimethylsilyloxy), a hetero-ring oxy group (preferably a substituted or unsubstituted hetero-ring oxy group having from 2 to 30 carbon atoms, for example, 1-phenyltetrazol-5-oxy and 2-tetrahydropyranyloxy), an acyloxy group (preferably a formyloxy group, a substituted or unsubstituted alkylcarbonyloxy group having from 2 to 30 carbon atoms, and a substituted or unsubstituted arylcarbonyloxy group having from 6 to 30 carbon atoms, for example, formyloxy, acetyloxy, pivaloyloxy, stearoyloxy, benzoyloxy, and p-methoxyphenylcarbonyloxy), a carbamoyloxy group (preferably a substituted or unsubstituted carbamoyloxy group having from 1 to 30 carbon atoms, for example, N,N-dimethylcarbamoyloxy, N,N-diethylcarbamoyloxy, morpholinocarbonyloxy, N,N-di-n-octylaminocarbonyloxy, and N-n-octylcarbamoyloxy), an alkoxycarbonyloxy group (preferably a substituted or unsubstituted alkoxycarbonyloxy group having from 2 to 30 carbon atoms, for example, methoxycarbonyloxy, ethoxycarbonyloxy, t-butoxycarbonyloxy, and n-octylcarbonyloxy), an aryloxycarbonyloxy group (preferably a substituted or unsubstituted aryloxycarbonyloxy group having from 7 to 30 carbon atoms, for example, phenoxycarbonyloxy, p-methoxyphenoxycarbonyloxy, and p-n-hexadecyloxyphenoxycarbonyloxy), an amino group (preferably an amino group, a substituted or unsubstituted alkylamino group having from 1 to 30 carbon atoms, and a substituted or unsubstituted anilino group having from 6 to 30 carbon atoms, for example, amino, methylamino, dimethylamino, anilino, N-methyl-anilino, and diphenylamino), an ammonio group (preferably an ammonio group and an ammonio group substituted with a substituted or unsubstituted alkyl, aryl or hetero ring having from 1 to 30 carbon atoms, for example, trimethylammonio, triethylammonio, and diphenylmethylammonio), an acylamino group (preferably a formylamino group, a substituted or unsubstituted alkylcarbonylamino group having from 1 to 30 carbon atoms, and a substituted or unsubstituted arylcarbonylamino group having from 6 to 30 carbon atoms, for example, formylamino, acetylamino, pivaloylamino, lauroylamino, benzoylamino, and 3,4,5-tri-n-octyloxyphenylcarbonylamino), an aminocarbonyl amino group (preferably a substituted or unsubstituted aminocarbonylamino group having from 1 to 30 carbon atoms, for example, carbamoylamino, N,N-dimethylaminocarbonylamino, N,N-diethylaminocarbonylamino, and morpholinocarbonylamino), an alkoxycarbonylamino group (preferably a substituted or unsubstituted alkoxycarbonylamino group having from 2 to 30 carbon atoms, for example, methoxycarbonylamino, ethoxycarbonylamino, t-butoxycarbonylamino, n-octadecyloxycarbonylamino, and N-methyl-methoxycarbonylamino), an aryloxycabonylamino group (preferably a substituted or unsubstituted aryloxycarbonylamino group having from 7 to 30 carbon atoms, for example, phenoxycarbonylamino, p-chlorophenoxycarbonylamino, and m-n-octyloxyphenoxycarbonylamino), a sulfamoylamino group (preferably a substituted or unsubstituted sulfamoylamino group having from 0 to 30 carbon atoms, for example, sulfamoylamino, N,N-dimethylaminosulfonylamino, and N-n-octylaminosulfonylamino), an alkyl- or arylsulfonylamino group (preferably a substituted or unsubstituted alkylsulfonylamino group having from 1 to 30 carbon atoms and a substituted or unsubstituted arylsulfonylamino group having from 6 to 30 carbon atoms, for example, methylsulfonylamino, butylsulfonylamino, phenylsulfonylamino, 2,3,5-trichlorophenylsulfonylamino, and p-methylphenylsulfonylamino), a mercapto group, an alkylthio group (preferably a substituted or unsubstituted alkylthio group having from 1 to 30 carbon atoms, for example, methylthio, ethylthio, and n-hexadecylthio), an arylthio group (preferably a substituted or unsubstituted arylthio group having from 6 to 30 carbon atoms, for example, phenylthio, p-chlorophenylthio, and m-methoxyphenylthio), a hetero-ring thio group (preferably a substituted or unsubstituted hetero-ring thio group having from 2 to 30 carbon atoms, for example, 2-benzothiazolylthio and 1-phenyltetrazol-5-ylthio), a sulfamoyl group (preferably a substituted or unsubstituted sulfamoyl group having from 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, and N-(N'-phenylcarbamoyl)sulfamoyl), a sulfo group, an alkyl- or arylsulfinyl group (preferably a substituted or unsubstituted alkylsulfinyl group having from 1 to 30 carbon atoms and a substituted or unsubstituted arylsulfinyl group having from 6 to 30 carbon atoms, for example, methylsulfinyl, ethylsulfinyl, phenylsulfinyl, and p-methylphenylsulfinyl), an alkyl- or arylsulfonyl group (preferably a substituted or unsubstituted alkylsulfonyl group having from 1 to 30 carbon atoms and a substituted or unsubstituted arylsulfonyl group having from 6 to 30 carbon atoms, for example, methylsulfonyl, ethylsulfonyl, phenylsulfonyl, and p-methylphenylsulfonyl), an acyl group (preferably a formyl group, a substituted or unsubstituted alkylcarbonyl group having from 2 to 30 carbon atoms, a substituted or unsubstituted arylcarbonyl group having from 7 to 30 carbon atoms, and a substituted or unsubstituted hetero-ring carbonyl group having from 4 to 30 carbon atoms and having a carbonyl group bound to a carbon atom, for example, acetyl, pivaloyl, 2-chloroacetyl, stearoyl, benzoyl, p-n-octyloxyphenylcarbonyl, 2-pyridylcarbonyl, and 2-furylcarbonyl), an aryloxycarbonyl group (preferably a substituted or unsubstituted aryloxycarbonyl group having from 7 to 30 carbon atoms, for example, phenoxycarbonyl, o-chlorophenoxycarbonyl, m-nitrophenoxycarbonyl, and p-t-butylphenoxycarbonyl), an alkoxycarbonyl group (preferably a substituted or unsubstituted alkoxycarbonyl group having from 2 to 30 carbon atoms, for example, methoxycarbonyl, ethoxycarbonyl, t-butoxycarbonyl, and n-octadecyloxycarbonyl), a carbamoyl group (preferably a substituted or unsubstituted carbamoyl group having from 1 to 30 carbon atoms, for example, carbamoyl, N-methylcarbamoyl, N,N-dimethylcarbamoyl, N,N-di-n-octylcarbamoyl, and N-(methylsulfonyl)carbamoyl), an aryl or hetero-ring azo group (preferably a substituted or unsubstituted aryl azo group having from 6 to 30 carbon atoms and a substituted or unsubstituted hetero-ring azo group having from 3 to 30 carbon atoms, for example, phenylazo, p-chlorophenylazo, and 5-ethylthio-1,3,4-thiadiazol-2-ylazo), an imide group (preferably N-succinimide and N-phthalimide), a phosphino group (preferably a substituted or unsubstituted phosphino group having from 2 to 30 carbon atoms, for example, dimethylphosphino, diphenylphosphino, and methylphenoxyphosphino), a phosphinyl group (preferably a substituted or unsubstituted phosphinyl group having from 2 to 30 carbon atoms, for example, phosphinyl, dioctyloxyphosphinyl, and diethoxyphosphinyl), a phosphinyloxy group (preferably a substituted or unsubstituted phosphinyloxy group having from 2 to 30 carbon atoms, for example, diphenoxyphosphinyloxy and dioctyloxyphosphinyloxy), a phosphinylamino group (preferably a substituted or unsubstituted phosphinylamino group having from 2 to 30 carbon atoms, for example, dimethoxyphosphinylamino and dimethylaminophosphinylamino), a phospho group, a silyl group (preferably a substituted or unsubstituted silyl group having from 3 to 30 carbon atoms, for example, trimethylsilyl, triethylsilyl, triisopropylsilyl, t-butyldimethylsilyl, and phenyldimethylsilyl), a hydrazino group (preferably a substituted or substituted hydrazino group having from 0 to 30 carbon atoms, for example, trimethylhydrazino), or a ureido group (preferably a substituted or unsubstituted ureido group having from 0 to 30 carbon atoms, for example, N,N-dimethylureido).

Also, two Ws can be taken together to form a ring (an aromatic or non-aromatic hydrocarbon ring or a hetero ring; these rings being able to be further combined to form a polycyclic fused ring; for example, a benzene ring, a naphthalene ring, an anthracene ring, a phenanthracene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathine ring, a phenothiazine ring, and a phenazine ring).

In the foregoing substituents for W, with respect to those containing a hydrogen atom, after removing the subject hydrogen atom, the foregoing group may be further substituted thereon. Examples of such a substituent include a $-CONHSO_2-$ group (a sulfonylcarbamoyl group or a carbonylsulfamoyl group), a $-CONHCO-$ group (a carbonylcarbamoyl group), and an $-SO_2NHSO_2-$ group (a sulfonylsulfamoyl group).

More concretely, examples include an alkylcabonylaminosulfonyl group (for example, acetylaminosulfonyl), an arylcarbonylaminosulfonyl group (for example, benzoylaminosulfonyl), an alkylsulfonylaminocarbonyl group (for example, methylsulfonylaminocarbonyl), and an arylsulfonylaminocarbonyl group (for example, p-methylphenylsulfonylaminocarbonyl).

In the general formula (I), $R^1$ to $R^{16}$ each independently represents a hydrogen atom or a substituent. Examples of the substituent include those described above for W.

In general, in a phthalocyanine based compound containing plural substituents, a position isomer in which a position at which the substituent is bound is different can exist. The compound represented by the general formula (I) of the invention is not exceptional, too, and as the case may be, several kinds of position isomers may be thought. In the invention, though the phthalocyanine based compound may be used as a single compound, it can also be used as a mixture of position isomers. In the case where the phthalocyanine based compound is used as a mixture of position isomers, any number of position isomers which are mixed, any substitution position of a substituent in each position isomer and any mixing ratio of position isomers are applicable.

In the invention, it is preferable that the compound represented by the general formula (I) is a compound selected from those represented by the following general formula (II).

General Formula (II)

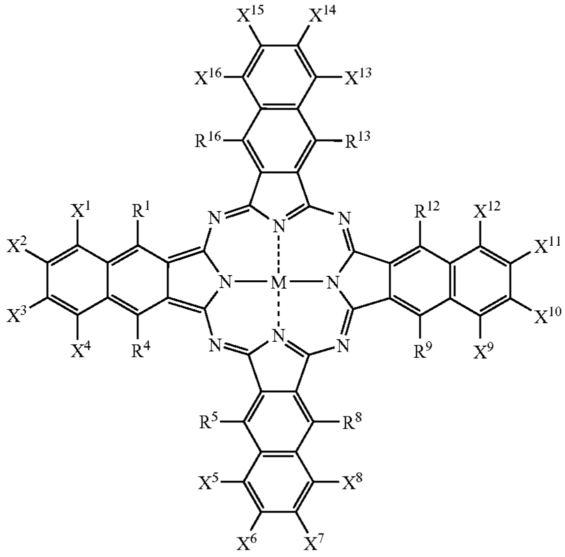

In the formula, M is synonymous with one in the general formula (I); $R^1$, $R^4$, $R^5$, $R^8$, $R^9$, $R^{12}$, $R^{13}$ and $R^{16}$ are synonymous with those in the general formula (I); and $X^1$ to $X^{16}$ each independently represents a hydrogen atom or a substituent.

The general formula (II) is hereunder described.

M is synonymous with one in the general formula (I); examples thereof include the same as described above, with preferred examples thereof being also the same. $R^1$, $R^4$, $R^5$, $R^8$, $R^9$, $R^{12}$, $R^{13}$ and $R^{16}$ are synonymous with those in the general formula (I); examples thereof include the same substituents as described above; and $R^1$, $R^4$, $R^5$, $R^8$, $R^9$, $R^{12}$, $R^{13}$ and $R^{16}$ are each preferably a hydrogen atom or an alkoxy group, with a hydrogen atom being more preferable. $X^1$ to $X^{16}$ each independently represents a hydrogen atom or a substituent. Examples of the substituent include those described above for W. $X^1$ to $X^{16}$ are each preferably a hydrogen atom.

Specific examples of the infrared dye which is used in the invention are given below.

However, it should not be construed that the invention is limited to the following examples.

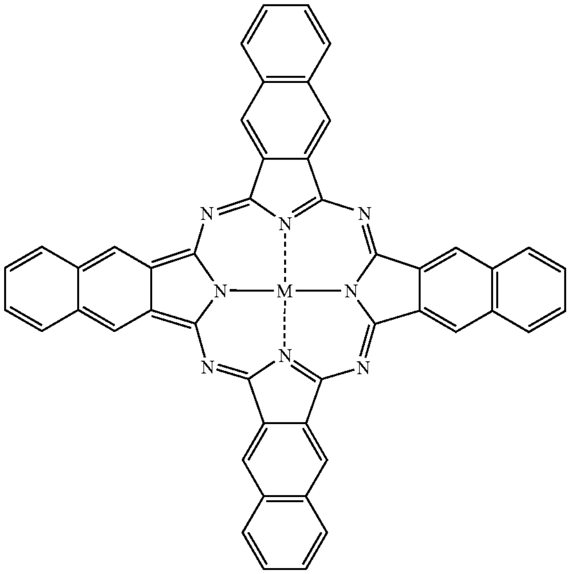
(1) M=(V═O)
(2) M=Co
(3) M=GaCl
(4) M=Sn
(5) M=ClSnCl
(6) M=Ni
(7) M=Cu
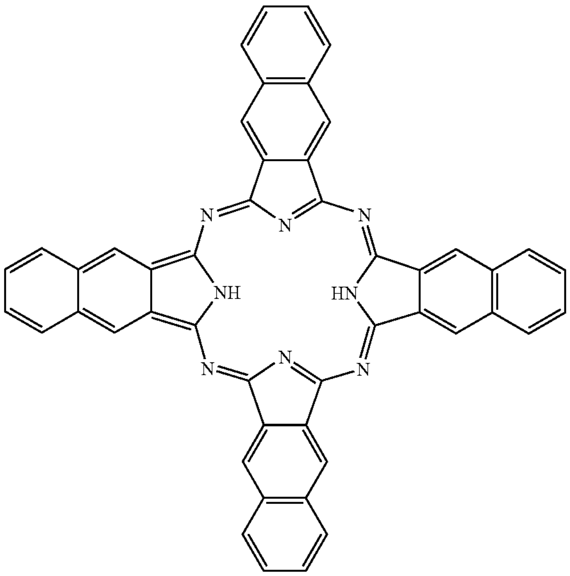
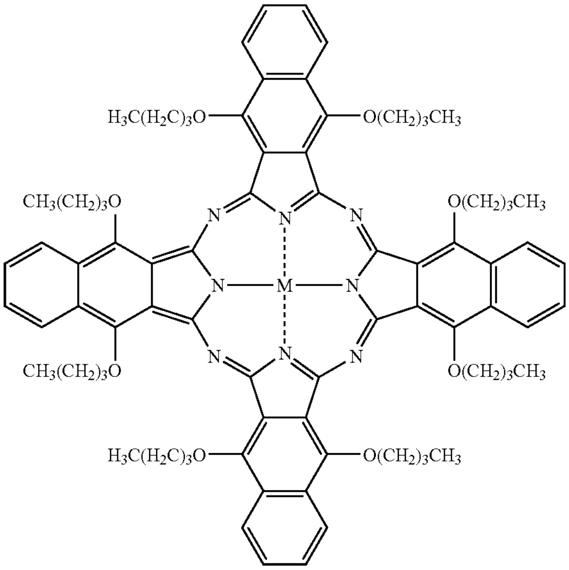
(9) M=Cu
(10) M=Ni
(11) M=(Cl—Si—Cl)
(12) M=(n-$C_8H_{17}O$—Si—$OC_8H_{17}$-n)
(13)
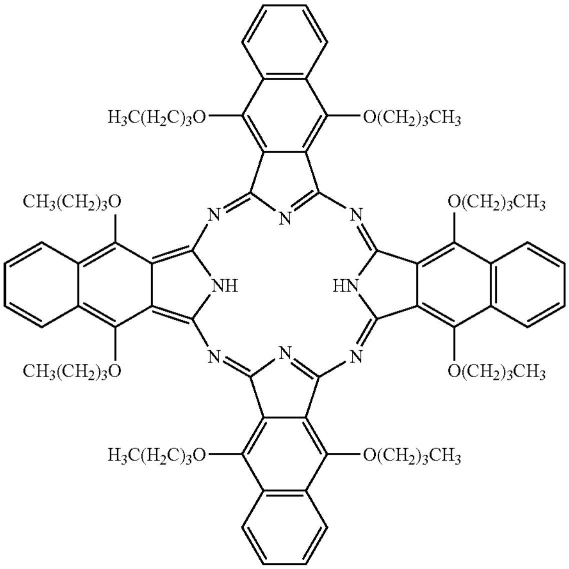

-continued
(14)
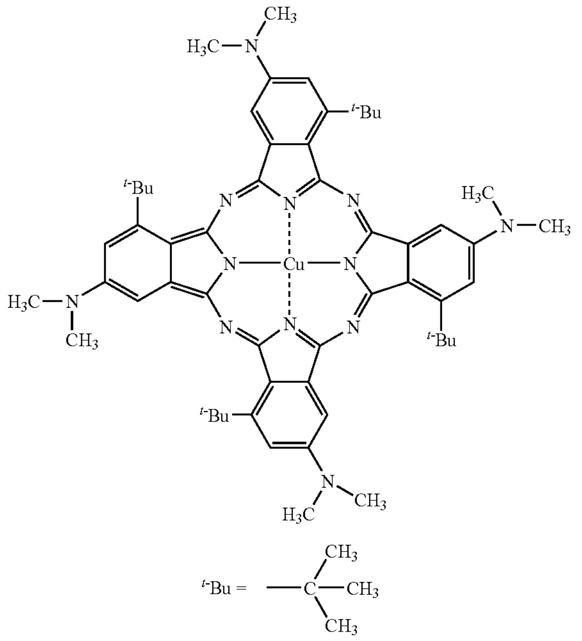
(A position isomer mixture is expressed as one compound.)
(15)
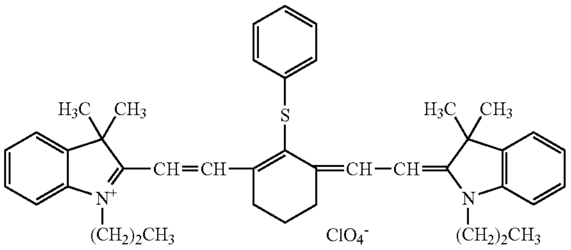
(16)
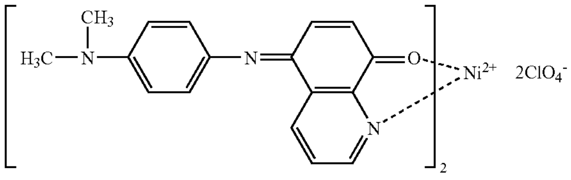
(17)
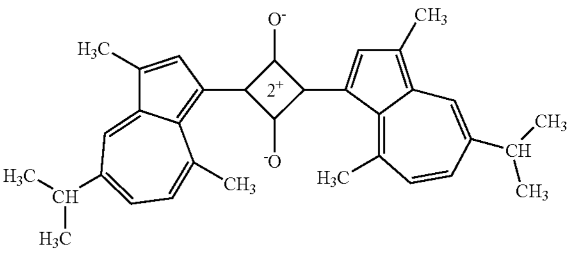
-continued
(18)
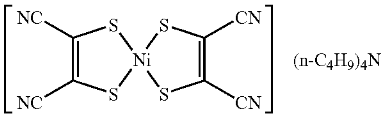
(19)
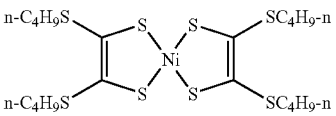
(20)
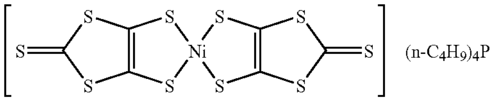
(21)
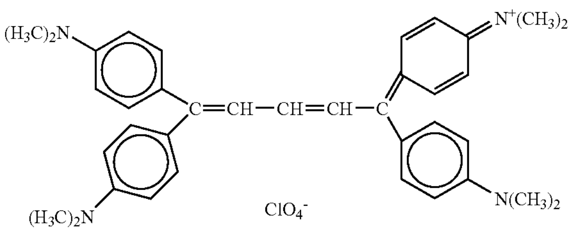
(22)
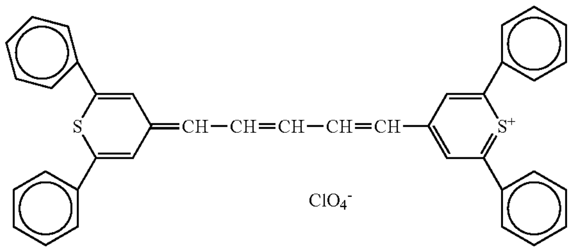
(23)
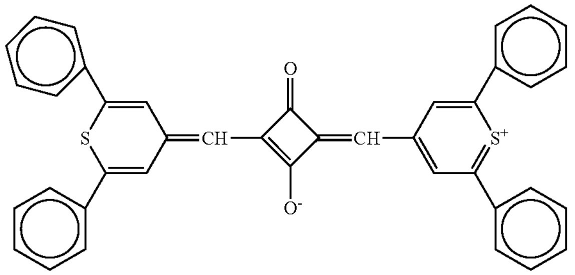
(24)
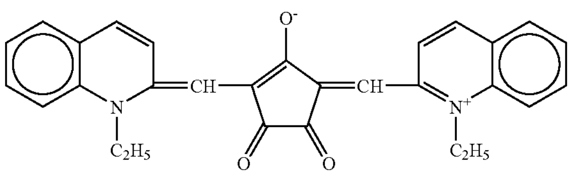

-continued (25)

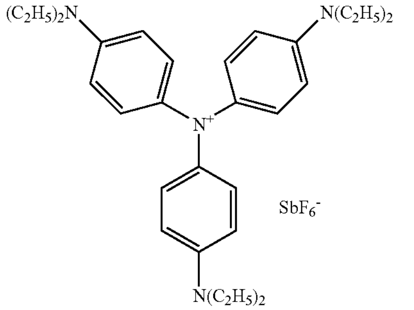

(26)

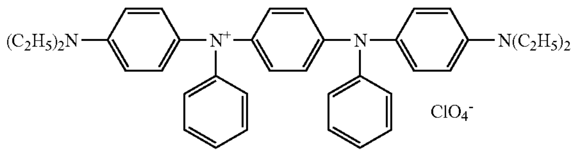

(27)

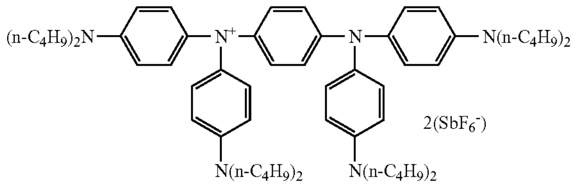

(28)

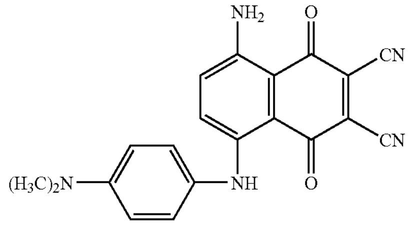

(29)

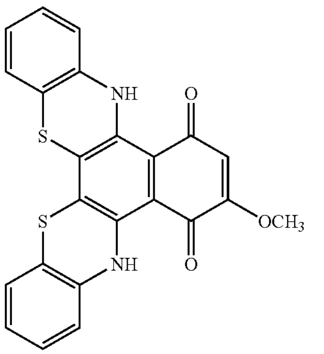

With respect to the phthalocyanine ring forming reaction of the phthalocyanine based compound which is preferably used in the invention, though any known synthesis method is employable, for example, methods described in *Phthalocyanines—Chemistry and Function—*, pages 1 to 62, edited and written by Hirofusa Shirai and Nagao Kobayashi and published by Industrial Publishing & Consulting, Inc. (1997) and *Phthalocyanines as Functional Dye,* pages 29 to 77, edited by Ryo Hirohashi, Keiichi Sakamoto and Eiko Okumura and published by Industrial Publishing & Consulting, Inc. (2004) can be employed. Examples of a representative synthesis method of the phthalocyanine based compound include a Wyler method, a phthalonitrile method, a lithium method, a sub-phthalocyanine method, and a chlorinated phthalocyanine method as described these references.

The second photoelectric conversion device has sensitivity in a third wavelength region as shown by a dashed line in FIG. 5. In the n-region 3, its depth is determined so as to have sensitivity in from a visible region to an infrared region as shown by a long dashed short line in FIG. 5. The infrared transmitting filter 12 transmits only light of the third wavelength region as shown by a long dashed double-short dashed line in FIG. 5. The second photoelectric conversion device having sensitivity in the third wavelength region is realized by the n-region 3 and the infrared transmitting filter 12 each having such a characteristic. Incidentally, by designing the n-region 3 so as to have sensitivity only in the third wavelength region, it is possible to omit the infrared transmitting filter 12.

The gain control and A/D conversion section 20 sets up a gain such that even when the quantity of illumination light fluctuates, an average value of an imaging signal obtained from the first photoelectric conversion device and an average value of an imaging signal obtained from the second photoelectric conversion device are a fixed value, respectively.

The information reader of the present embodiment is able to read information expressed by a mark printed on the printed matter 40 (for example, coordinate position information on the printed matter 40) with high precision by signal processing as described later.

FIGS. 6A to 6D are each a diagram to explain a characteristic of a subject or an imaging device.

Figure 6A:
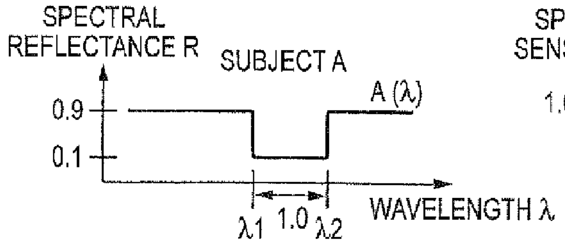
FIGS. 6A to 6D are each a diagram to explain a characteristic of a subject or an imaging device.
Figure 6C:
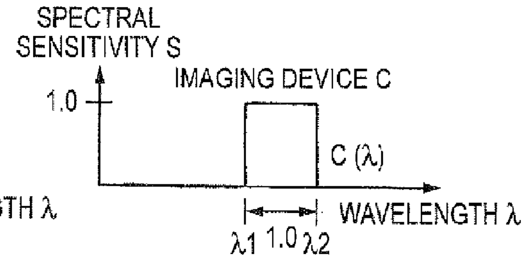
Figure 6B:
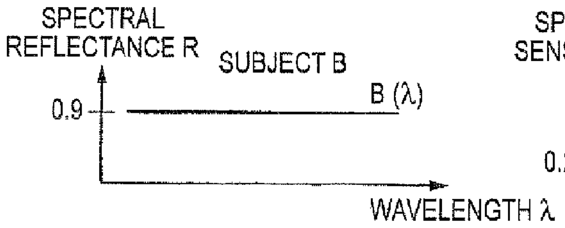
Figure 6D:
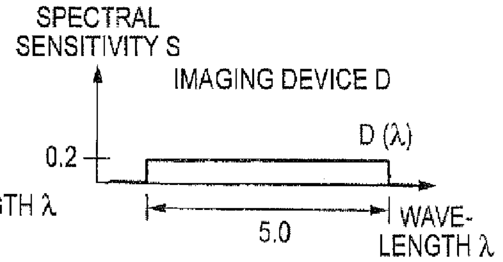

As illustrated in FIGS. 6A and 6B, in the printed matter 40, in a portion printed with a mark, since light from the light source 11 is absorbed, a spectral reflectance R is 0.1; and in a portion not printed with a mark, since light from the light source 11 is reflected, a spectral reflectance R is 0.9. Also, as illustrated in FIGS. 6C and 6D, the first photoelectric conversion device has sensitivity in the second wavelength region the same as the absorption wavelength region of the printed portion; and the second photoelectric conversion device has sensitivity in the third wavelength region in a range including the absorption wavelength region of the printed portion and wider than this. In the case where the waveforms as shown in FIGS. 6A to 6D are expressed by functions A(λ), B(λ), C(λ) and D(λ) using a wavelength λ as a variable, respectively, as shown in FIG. 7, when the printed matter 40 is imaged by the first photoelectric conversion device, a contrast ratio of the portion with printing to the portion without printing is 1/9; and when the printed matter 40 is imaged by the second photoelectric conversion device, a contrast ratio of the portion with printing to the portion without printing is 1/1.22.

Namely, with respect to the imaging signal obtained from the first photoelectric conversion device, it is noted that though changes due to the presence or absence of a mark are large, changes by luminance shading such as unevenness in the quantity of light from the light source 11, unevenness in the reflection in the printed matter 40 and unevenness in the absorption of light in the printed matter 40, noises caused due to a stain and a smudge of the printed matter 40, noises which the first photoelectric conversion device per se possesses, and the like are small.

On the other hand, with respect to the imaging signal obtained from the second photoelectric conversion device, it is noted that though changes due to the presence or absence of a mark are small, changes by luminance shading, noises caused due to a stain and a smudge of the printed matter 40, noises which the second photoelectric conversion device per se possesses, and the like are large.

For these reasons, when the information expressed by a mark is read by using an imaging signal obtained from the first photoelectric conversion device and an imaging signal obtained from the second photoelectric conversion device, it is possible to realize an imaging device which is less in influences by illuminance shading, noises, and the like and which has high reliability and high sensitivity. In the information reader, by generating the information expressed by a mark and outputting it based on an imaging signal obtained from the first photoelectric conversion device and an imaging signal obtained from the second photoelectric conversion device, the signal processing section 30 realizes reading of the information with high precision. Such signal processing is hereunder described. This signal processing includes four patterns, and any one of these patterns can be employed.

(First Signal Processing Pattern)

Figure 8:
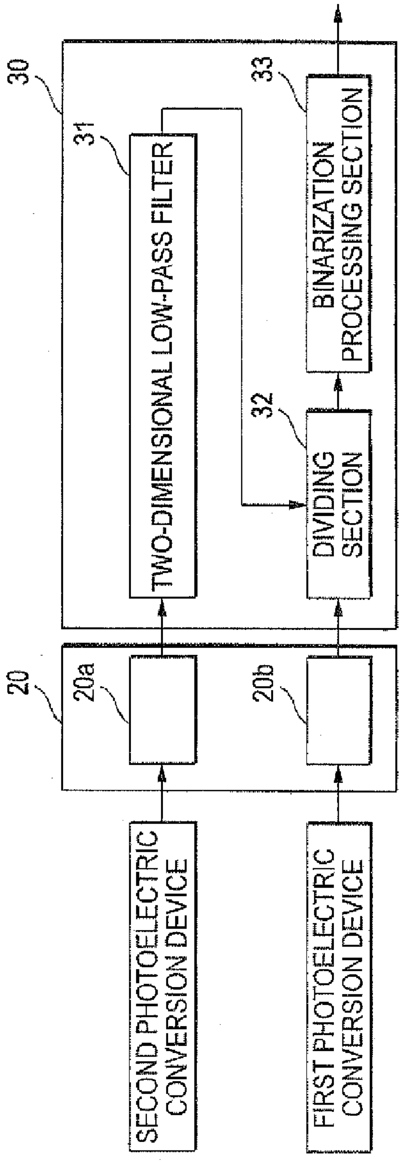
FIG. 8 is a diagram to show an internal block of each of a gain control and A/D conversion section and s signal processing section for the purpose of realizing a first signal processing pattern.

FIG. 8 is a diagram to show an internal block of each of the gain control and A/D conversion section 20 and the signal processing section 30 for the purpose of realizing a first signal processing pattern.

The gain control and A/D conversion section 20 includes a block 20*a* for controlling a gain of an imaging signal from the second photoelectric conversion device and executing A/D conversion, and a block 20*b* for controlling a gain of an imaging signal from the first photoelectric conversion device and executing A/D conversion. The signal processing section 30 functions as the information output unit recited in the appended claims.

The signal processing section 30 includes a two-dimensional low-pass filter 31, a dividing section 32, and a binarization processing section 33. The two-dimensional low-pass filter 31 functions as the noise removal unit recited in the appended claims. The dividing section 32 functions as the luminance shading correction unit recited in the appended claims. The binarization processing section 33 functions as the information generation unit recited in the appended claims.

The two-dimensional low-pass filter 31 removes a noise component by scratches, dusts, etc. on the printed matter 40 contained in the imaging signal outputted from the block 20*a*. Since the imaging signal obtained from the second photoelectric conversion device is a signal which is largely influenced by the luminance shading or other noise components, an imaging signal resulting from removing the noise component from this imaging signal becomes an imaging signal relying upon the luminance shading.

The dividing section 32 corrects the luminance shading generated in the imaging signal obtained from the first photoelectric conversion device by dividing the imaging signal outputted from the block 20*b* by the imaging signal from which the noise component has been removed by the two-dimensional low-pass filter 31.

The binarization processing section 33 binarizes the imaging signal whose luminance shading has been corrected in the dividing section 32 on the basis of a prescribed value; subjecting this binarized data to processing for correcting a geometric distortion (Keystone distortion) of an image generated in the case of imaging the printed matter 40 from an oblique direction or a change in the image rotation magnification generated in the case where the printed matter 40 is rotated against the imaging system or the distance is changed; and generates information expressed with a mark printed on the printed matter 40 based on the binarized data after the correction. As this prescribed value, for example, a median value between a maximum value and a minimum value of the imaging signal outputted from the dividing section 32, an average value of the imaging signal outputted from the dividing section 32, or a median value of a histogram of the imaging signal outputted from the dividing section 32 may be employed.

In the thus configured information reader, when the printed matter 40 is imaged, an imaging signal is outputted from each of the first photoelectric conversion device and the second photoelectric conversion device. The outputted imaging signals are inputted into the signal processing section 30 via the gain control and A/D conversion section 20. In the signal processing section 30, the noise component contained in the imaging signal from the second photoelectric conversion device is removed, and the imaging signal from the first photoelectric conversion device is divided by the imaging signal from the second photoelectric conversion device from which the noise component has been removed, whereby the luminance shading is corrected. The imaging signal whose luminance shading has been corrected is binarized, and the information is then restored.

According to such a configuration, since the information can be restored in a state that the influences by the luminance shading and noises have been eliminated, it is possible to achieve reading of the information with high precision.

Incidentally, in FIG. 8, though the two-dimensional low-pass filter 31 is provided for the purpose of removing a noise component, this two-dimensional low-pass filter 31 may be omitted. In that case, the configuration is made such that the imaging signal outputted from the block 20*a* is inputted directly into the dividing section 32; and in the dividing section 32, by dividing the imaging signal outputted from the block 20*b* by the imaging signal outputted from the block 20*a*, the luminance shading is corrected. In such case, since the imaging signal outputted from the block 20*a* contains a noise component, though the reading precision of information is inferior as compared with the case where the two-dimensional filter 31 is provided, reading of information can be achieved with high precision as compared with the case of the related art.

(Second Signal Processing Pattern)

Figure 9:
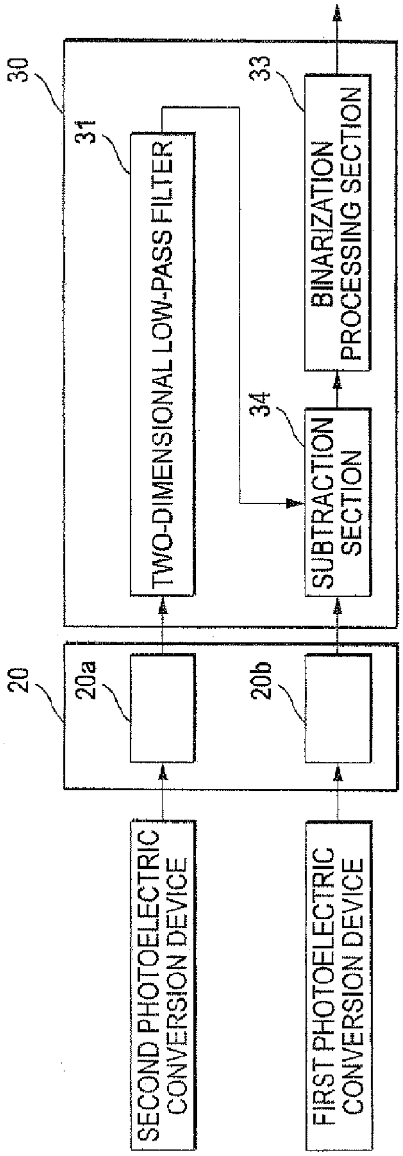
FIG. 9 is a diagram to show an internal block of each of a gain control and A/D conversion section and s signal processing section for the purpose of realizing a second signal processing pattern.

FIG. 9 is a diagram to show an internal block of each of the gain control and A/D conversion section 20 and the signal processing section 30 for the purpose of realizing a second signal processing pattern. In FIG. 9, the same constitutions as in FIG. 8 are given the same symbols. The configuration as shown in FIG. 9 is a configuration in which the dividing section 32 as shown in FIG. 8 is changed to a subtraction section 34. The subtraction section 34 functions as the luminance shading correction unit recited in the appended claims.

The subtraction section 34 corrects the luminance shading generated in the imaging signal obtained from the first photoelectric conversion device by subtracting the imaging signal from which the noise component has been removed by the two-dimensional low-pass filter 31 from the imaging signal outputted from the block 20*b*.

In the information reader having such a configuration, first of all, the printed matter 40 not printed with a mark is imaged by the imaging section 10; and gains of the blocks 20*a* and 20*b* are set up such that a difference between the imaging signal obtained from the first photoelectric conversion device and the imaging signal obtained by the second photoelectric conversion device is substantially zero. When the printed matter 40 is imaged from this state, an imaging signal is outputted from each of the first photoelectric conversion device and the second photoelectric conversion device. The outputted imaging signals are inputted into the signal processing section 30 via the gain control and A/D conversion section 20. In the signal processing section 30, the noise component contained in the imaging signal from the second photoelectric conversion device is removed, and the imaging signal from the second photoelectric conversion device from which the noise component has been removed is subtracted from the imaging signal from the first photoelectric conversion device, whereby the luminance shading is corrected. The imaging signal whose luminance shading has been corrected is binarized, whereby the information is restored.

According to such a configuration, since the information can be restored in a state that the influences by the luminance shading and noises have been eliminated, it is possible to achieve reading of the information with high precision. Also, since the subtraction section 34 is used in place of the dividing section 32, there is brought an advantage that the circuit configuration is simple as compared with the first signal processing pattern.

Incidentally, in FIG. 9, the two-dimensional low-pass filter 31 can be omitted, too. Also, as a prescribed value which the binarization processing section 33 uses, for example, a median value between a maximum value and a minimum value of the imaging signal outputted from the subtraction section 34, an average value of the imaging signal outputted from the subtraction section 34, or a median value of a histogram of the imaging signal outputted from the subtraction section 34 may be employed.

(Third Signal Processing Pattern)

Figure 10:
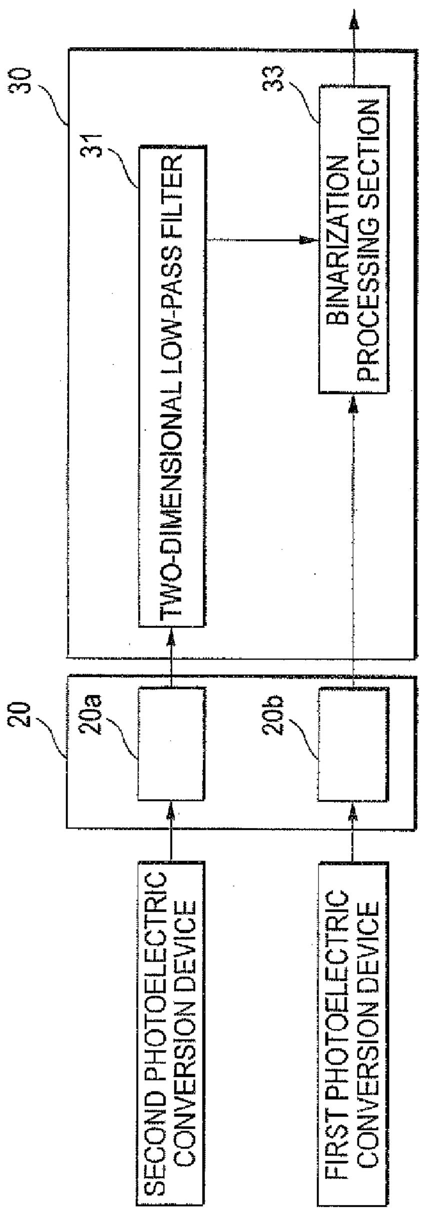
FIG. 10 is a diagram to show an internal block of each of a gain control and A/D conversion section and s signal processing section for the purpose of realizing a third signal processing pattern.

FIG. 10 is a diagram to show an internal block of each of the gain control and A/D conversion section 20 and the signal processing section 30 for the purpose of realizing a third signal processing pattern. In FIG. 10, the same constitutions as in FIG. 8 are given the same symbols. The configuration as shown in FIG. 10 is a configuration in which the dividing section 32 as shown in FIG. 8 is omitted and the imaging signal outputted from the two-dimensional low-pass filter 31 and the imaging signal outputted from the block 20*b* are inputted directly into the binarization processing section 33.

The binarization processing section 33 binarizes the imaging signal outputted from the block 20*b* on the basis of a prescribed value; subjecting this binarized data to processing for correcting a geometric distortion (Keystone distortion) or a change in the image rotation magnification; and generates information expressed with a mark printed on the printed matter 40 based on the binarized data after the correction. At this point, the function of this binarization processing section 33 is the same as in that in the first signal processing pattern. However, the third signal processing pattern is characterized in that the prescribed value which the binarization processing section 33 uses is the imaging signal outputted from the two-dimensional low-pass filter 31. For example, as the foregoing prescribed value, a value obtained by subtracting a fixed value from the imaging signal outputted from the two-dimensional low-pass filter 31 or a value obtained by multiplying the imaging signal outputted from the two-dimensional low-pass filter 31 by a fixed coefficient can be employed.

In the thus configured information reader, when the printed matter 40 is imaged, an imaging signal is outputted from each of the first photoelectric conversion device and the second photoelectric conversion device. The outputted imaging signals are inputted into the signal processing section 30 via the gain control and A/D conversion section 20. In the signal processing section 30, the noise component contained in the imaging signal from the second photoelectric conversion device is removed, and the imaging signal from the first photoelectric conversion device is binarized on the basis of the imaging signal from the second photoelectric conversion device from which the noise component has been removed, whereby the information is restored.

According to such a configuration, since the influence of the luminance shading can be eliminated at the same time of the binarization processing and the information can be restored in a state that the influences of the luminance shading and noises have been eliminated, it is possible to achieve reading of the information with high precision. Also, since neither the dividing section 32 nor the subtraction section 34 is provided, there is brought an advantage that the circuit configuration is simple as compared with the first signal processing pattern or the second signal processing pattern.

Incidentally, in FIG. 10, the two-dimensional low-pass filter 31 can be omitted, too.

(Fourth Signal Processing Pattern)

Figure 11:
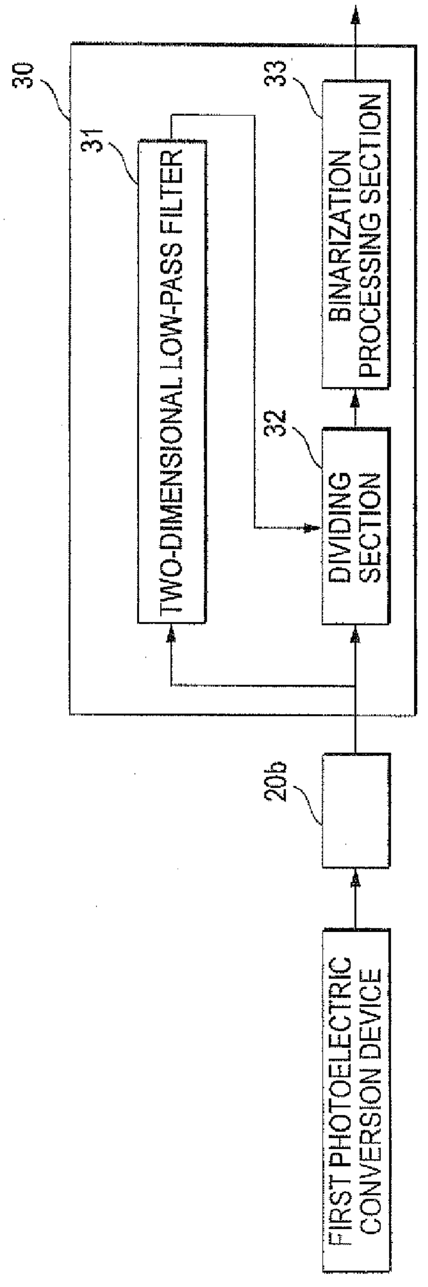
FIG. 11 is a diagram to show an internal block of each of a gain control and A/D conversion section and s signal processing section for the purpose of realizing a fourth signal processing pattern, wherein 10 denotes Imaging section, 11 denotes Light source, 12 denotes Infrared transmitting filter, 13 denotes Optical system, 14 denotes Imaging device, 20 denotes Gain control and A/D conversion section, 30 denotes Signal processing section, 40 denotes Printed matter, 100 denotes Pixel section.

FIG. 11 is a diagram to show an internal block of each of the gain control and A/D conversion section 20 and the signal processing section 30 for the purpose of realizing a fourth signal processing pattern. In FIG. 11 the same constitutions as in FIG. 8 are given the same symbols. The configuration as shown in FIG. 11 is a configuration in which the block 20*a* as shown in FIG. 8 is omitted and the imaging signal outputted from the block 20*b* is inputted into the two-dimensional low-pass filter 31.

The two-dimensional low-pass filter 31 in FIG. 11 removes noises contained in the imaging signal outputted from the block 20*b*. The dividing section 32 in FIG. 11 corrects the luminance shading generated in the imaging signal outputted from the block 20*b* by dividing the imaging signal outputted from the block 20*b* by the imaging signal outputted from the two-dimensional low-pass filter 31.

In the light of the above, even when the imaging signal from the second photoelectric conversion device is not used, it is possible to eliminate influences by the luminance shading and noises and to read the information with high precision.

Incidentally, in the present embodiment, while the second wavelength region and the third wavelength region have been set up in a specified range of an infrared region (a wavelength range of from about 820 nm to about 910 nm) and a specified range of an infrared region (a wavelength range of from about 760 nm to about 960 nm), respectively, it should not be construed that the invention is limited thereto. The effects can be obtained so far as the second wavelength region and the third wavelength region meet the requirement that the third wavelength region includes the second wavelength region and wider than the second wavelength region.

According to the invention, it is possible to provide an information reader capable of reading information with high precision expressed by a site for absorbing light of a specified wavelength region contained in a subject.

The entire disclosure of each and every foreign patent application from which the benefit of foreign priority has been claimed in the present application is incorporated herein by reference, as if fully set forth.

What is claimed is:

1. An information reader comprising:

an imaging device that images a subject illuminated with light in a first wavelength region;

an information-reading unit that reads information expressed by a site absorbing light in a second wavelength region, which is equal to or narrower than the first wavelength region contained in the subject, based on imaging signals from the imaging device; and an information output unit, wherein the imaging device is a stack-typed imaging device that comprises a plurality of pixel sections containing stacked two photoelectric conversion devices, with each of the two photoelectric conversion devices receiving light from the same position of the subject and converting it into the imaging signal, the two photoelectric conversion devices are a first photoelectric conversion device having sensitivity in the second wavelength region and a second photoelectric conversion device having sensitivity in a third wavelength region, which includes the second wavelength region and is wider than the second wavelength region, and the information output unit generates the information based on a first imaging signal obtained from the first photoelectric conversion device and a second imaging signal obtained form the second photoelectric conversion device, and outputs the information.

2. The information reader according to claim 1, wherein the information output unit comprises:

a luminance shading correction unit that corrects luminance shading generated in the first imaging signal obtained from the first photoelectric conversion device based on the second imaging signal obtained from the second photoelectric conversion device; and an information generation unit that generates the information from the first imaging signal after the correction.

3. The information reader according to claim 2, wherein the luminance shading correction unit takes a value, which is obtained by dividing the first imaging signal by the second imaging signal, as the first imaging signal after the correction.

4. The information reader according to claim 2, wherein the luminance shading correction unit takes a value, which is obtained by subtracting the second imaging signal from the first imaging signal, as the first imaging signal after the correction.

5. The information reader according to claim 2, wherein the information generation unit generates the information based on a value, which is obtained by binarizing the first imaging signal after the correction on the basis of a prescribed value.

6. The information reader according to claim 5, wherein the prescribed value is a median value between a maximum value and a minimum value of the first imaging signal after the correction, an average value of the first imaging signal after the correction, or a median value of a histogram of the first imaging signal after the correction.

7. The information reader according to claim 1, wherein the information output unit generates the information based on a value, which is obtained by binarizing the first imaging signal on the basis of the second imaging signal.

8. The information reader according to claim 1, wherein the information output unit comprises a noise removal unit that removes a noise component contained in the second imaging signal, and the second imaging signal which the information output unit uses for the purpose of generating the information is the second imaging signal after the removal of a noise component by the noise removal unit.

9. The information reader according to claim 1, wherein the first photoelectric conversion device comprises:

a pair of electrodes stacked above a semiconductor substrate; and an organic photoelectric conversion layer provided between the pair of electrodes, and the second photoelectric conversion device is a photodiode formed within the semiconductor substrate.

10. The information reader according to claim 9, further comprising:

an optical filter that is provided above the second photoelectric conversion device and transmits only light of the third wavelength region.

11. The information reader according to claim 1, wherein the first wavelength region is a specified range of an infrared region.

12. The information reader according to claim 9, wherein the first wavelength region is a specified range of an infrared region.

13. The information reader according to claim 12, wherein the organic photoelectric conversion layer comprises a phthalocyanine based compound.

14. The information reader according to claim 1, wherein the third wavelength region is an infrared region.

15. The information reader according to claim 1, wherein a light source for illuminating the subject is LED.

* * * * *